US005477605A

United States Patent [19]

McWilliams et al.

[11] Patent Number: 5,477,605

[45] Date of Patent: Dec. 26, 1995

[54] METHOD OF MANUFACTURING A RADIANT ELECTRIC HEATER

[75] Inventors: Joseph A. McWilliams; Ali Paybarah, both of Droitwich, United Kingdom

[73] Assignee: Ceramaspeed Limited, United Kingdom

[21] Appl. No.: 246,348

[22] Filed: May 19, 1994

[30] Foreign Application Priority Data

May 21, 1993 [GB] United Kingdom .................... 9310513

[51] Int. Cl.$^{6}$ ................................ H05B 3/00; H05K 3/20; H01K 3/22

[52] U.S. Cl. .................................. 29/611; 29/831; 29/848; 29/850

[58] Field of Search ............................ 29/831, 848, 849, 29/850, 611; 219/457, 464

[56] References Cited

U.S. PATENT DOCUMENTS

| | | | |
|---|---|---|---|
| 600,057 | 3/1898 | Ball | 338/280 |
| 3,991,298 | 11/1976 | Maake | 219/464 |
| 4,161,648 | 7/1979 | Göessler | 219/464 |
| 4,471,214 | 9/1984 | Göessler | 219/464 |
| 4,713,527 | 12/1987 | Kicherer et al. | 219/464 |
| 4,789,773 | 12/1988 | Mikschl | 219/464 |
| 5,048,176 | 9/1991 | Doerner | 29/611 |

FOREIGN PATENT DOCUMENTS

| | | |
|---|---|---|
| 44847/93 | 10/1994 | Australia . |
| 0071048 | 2/1983 | European Pat. Off. . |
| 0210575 | 4/1987 | European Pat. Off. . |
| 0585831 | 3/1994 | European Pat. Off. . |
| 2331931 | 6/1977 | France . |

*Primary Examiner*—P. W. Echols
*Attorney, Agent, or Firm*—Ira S. Dorman

[57] ABSTRACT

A radiant electric heater having an electric heating element in the form of an elongate electrically conductive strip supported on edge and partially embedded in a layer of microporous thermal and electrical insulation material in a support dish is manufactured by placing an elongate electrically conductive strip on edge in a groove in a press tool, such that a portion of the strip protrudes from the groove, the groove being formed of a pattern corresponding to that required for a heating element in the heater. A predetermined quantity of powdery microporous thermal and electrical insulation material is arranged between the press tool and a support dish of the heater, and the insulation material is compressed into the support dish with the press tool, the material being compacted to form a layer of a desired density and simultaneously compacted against the portion of the strip protruding from the groove, to secure the strip on edge in partial embedment in the layer of the insulation material.

29 Claims, 4 Drawing Sheets

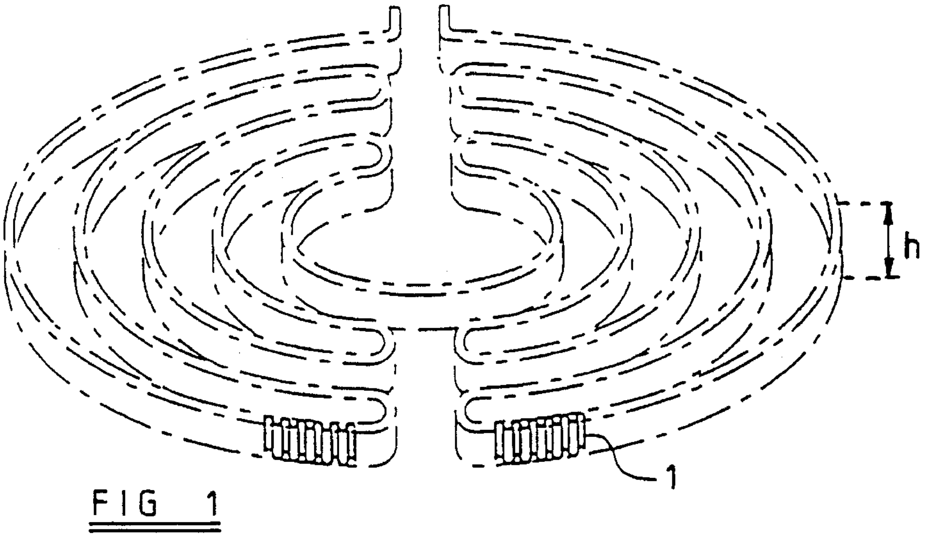
FIG 1
FIG 2
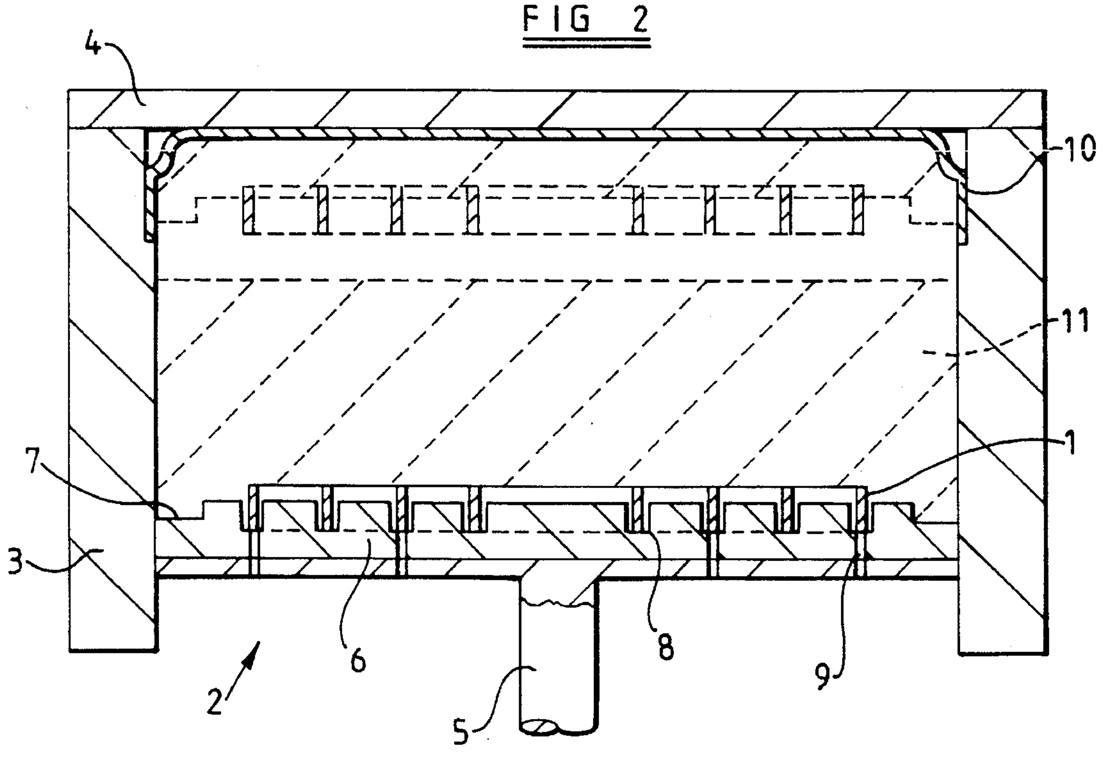
FIG 3
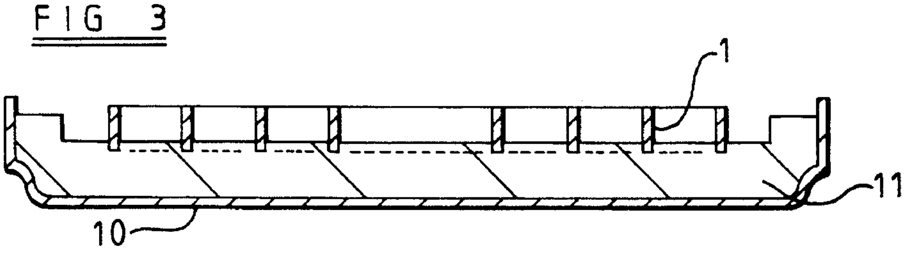

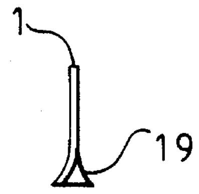
FIG 7a
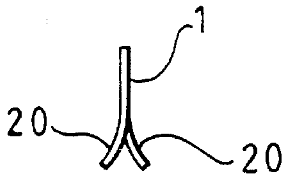
FIG 7b
FIG 8
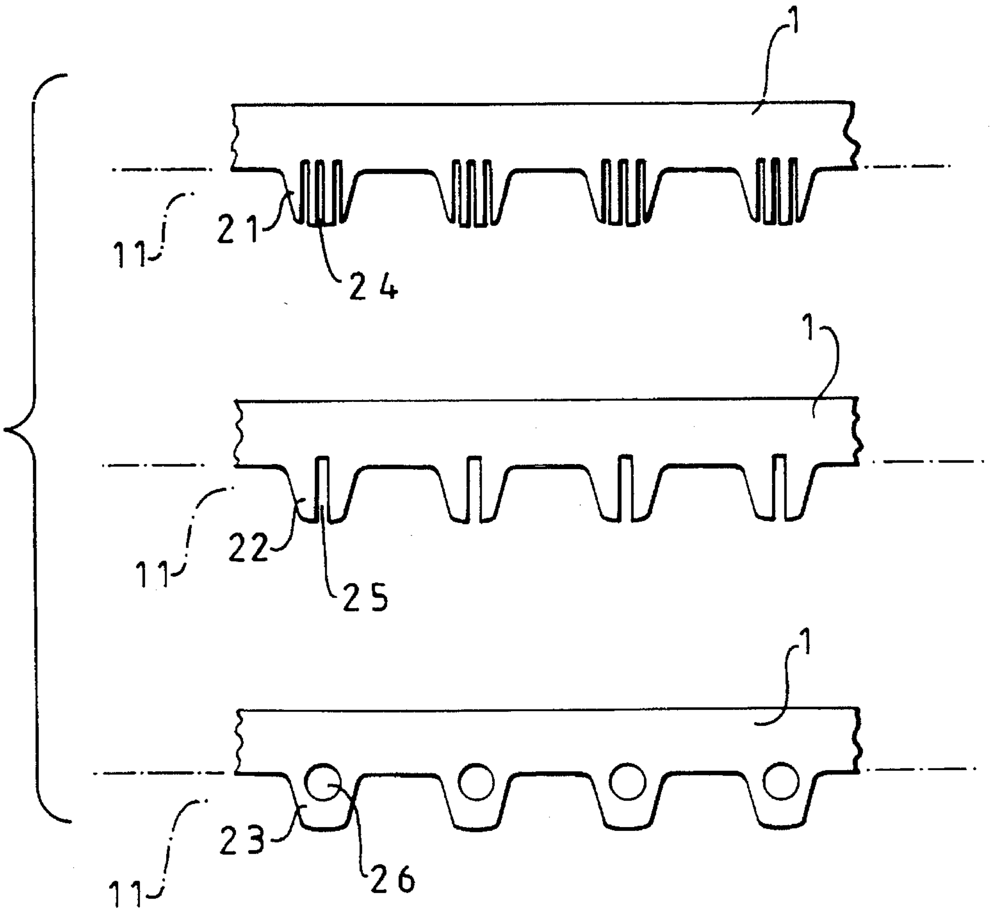

METHOD OF MANUFACTURING A RADIANT ELECTRIC HEATER

This invention relates to a method of manufacturing a radiant electric heater and more particularly the invention relates to a method of manufacturing a radiant heater, for example for a glass ceramic smooth top cooker, the heater having a heating element comprising an elongate electrically conductive strip supported on edge in a layer of microporous thermal and electrical insulation material in a support dish.

BACKGROUND TO THE INVENTION

The term 'microporous' is used herein to identify porous or cellular materials in which the ultimate size of the cells or voids is less than the mean free path of an air molecule at NTP, i.e. of the order of 100 nanometers or smaller. A material which is microporous in this sense will exhibit very low transfer of heat by air conduction (that is collisions between air molecules). Such microporous materials include aerogel, which is a gel in which the liquid phase has been replaced by a gaseous phase in such a way as to avoid the shrinkage which would occur if the gel were dried directly from a liquid. A substantially identical structure can be obtained by controlled precipitation from solution, the temperature and pH being controlled during precipitation to obtain an open lattice precipitate. Other equivalent open lattice structures include pyrogenic (fumed) and electrothermal types in which the average ultimate particle size is less than 100 nanometers. Any of these materials, based for example on silica, alumina or other metal oxides, may be used to prepare a composition which is microporous as defined above. Such microporous thermal insulation materials are well known in the art to which this invention relates.

DESCRIPTION OF PRIOR ART

It is known, for example from our co-pending European Patent Application No. 94300744.3, to embed an elongate electrically conductive strip in a layer of microporous thermal and electrical insulation material by urging the strip into the layer. The disadvantage of such a method of embedding the strip is that it is relatively easy to damage the strip and/or the layer with the result that the strip is not securely mounted in the layer.

OBJECT OF THE INVENTION

It is therefore an object of the present invention to provide a method of manufacturing a radiant electric heater in which the strip is more securely mounted in the layer.

SUMMARY OF THE INVENTION

According to the present invention there is provided a method of manufacturing a radiant electric heater having an electric heating element in the form of an elongate electrically conductive strip supported on edge and partially embedded in a layer of microporous thermal and electrical insulation material in a support dish, comprising the steps of:

- placing an elongate electrically conductive strip on edge in a groove in a press tool, such that a portion of the strip protrudes from the groove, the groove being formed of a pattern corresponding to that required for a heating element in the heater;
- disposing a predetermined quantity of powdery microporous thermal and electrical insulation material between the press tool and a support dish of the heater; and
- compressing the insulation material into the support dish with the press tool, the material being compacted to form a layer of a desired density and simultaneously compacted against the portion of the strip protruding from the groove, to secure the strip on edge in partial embedment in the layer of material.

The groove in the press tool may be provided of a depth corresponding to that proportion of height of the strip required to be unembedded in the layer of compacted insulation material.

The electrically conductive strip is preferably of corrugated (also known as sinuous, serpentine or convoluted) form along its length.

The portion of the strip protruding from the groove and which is subsequently embedded in the insulation material may be profiled, shaped or configured to enhance securement of the strip in the insulation material. Such portion of the strip protruding from the groove may be provided with a plurality of spaced-apart holes therein along the length of the strip. Alternatively, such portion of the strip protruding from the groove may incorporate a plurality of edgewise-entering slots or slits. Material of the strip between at least some of the slots or slits, may, if desired, be twisted, or may be bent sideways to further enhance securement of the strip in the insulation material. Preferably, the strip material between some of the slots or slits is bent sideways to one side, while the strip material between others of the slots or slits is bent sideways to the opposite side.

In another arrangement, the portion of the strip protruding from the groove and which is subsequently embedded in the insulation material may comprise or include spaced-apart tabs integral with the strip. At least some of such tabs may incorporate holes and/or edgewise-entering slits or slots. At least some of the tabs, or portions thereof, may be twisted, or may be bent sideways, with the possibility of one or more being bent to one side and one or more others being bent to the opposite side.

Profiling, shaping or configuring of the said portion of the strip protruding from the groove as aforementioned is also further advantageous in that it results in enhanced performance of the resulting heater. In this regard, reference is directed to co-pending British Patent Applications Nos. 9302689.6 and 9302693.8.

The electrically conductive strip suitably comprises a metal, or a metal alloy, such as an iron-chromium-aluminum alloy.

If desired, in a modified method, a predetermined quantity of an additional microporous insulation material may be disposed between the said powdery microporous insulation material and the support dish.

As a further alternative, the method may include a preliminary step of disposing a predetermined quantity of an additional microporous insulation material between an additional press tool and the support dish, the additional insulation material being compressed into the support dish by means of the additional press tool. The subsequent steps, involving the electrically conductive strip with its associated powdery microporous thermal insulation material, are then carried out. If desired, the additional insulation material may be compressed, in the preliminary step, to a density below its desired final density, the final density being attained during the subsequent compression step involving the electrically conductive strip with its associated insulation material.

The additional microporous insulation material is suitably based on silica whereas the microporous insulation material in which the electrically conductive strip is partially embedded can be selected with particular regard to high temperature-withstanding properties and may be advantageously based on alumina. It need only be of sufficient thickness to accommodate the embedded portion of the strip.

Without the provision of the additional insulation material, the microporous insulation material is suitably based on silica, but may advantageously include a small quantity of alumina powder to resist shrinkage. A typical example of such insulation material comprises a highly dispersed silica powder, such as silica aerogel or pyrogenic (fumed) silica, mixed with ceramic fibre reinforcement, titanium dioxide opacifier and the aforementioned small quantity of alumina powder.

The desired final density to which the microporous thermal insulation material is compacted is typically of the order of 300–400 kg/m$^3$.

Methods, in accordance with the invention, of manufacturing a radiant electric heater, and radiant heaters manufactured by the methods, will now be described by way of example, with reference to the accompanying drawings, in which:

BRIEF DESCRIPTION OF THE DRAWINGS

FIG. 1 is a perspective view of a heating element in the form of an elongate electrically conductive strip, of the type used in a radiant electric heater manufactured according to the invention;

FIG. 2 is a schematic sectional view of an arrangement for manufacturing a radiant electric heater;

FIG. 3 is a sectional view of a radiant electric heater manufactured with the arrangement of FIG. 2;

FIGS. 7, 7*a*, 7*b* and 8 represent side and sectional views of portions of heating elements in the form of electrically conductive strips, with various alternative configurations of edge regions thereof for embedment in microporous thermal insulation material.

DESCRIPTION OF PREFERRED EMBODIMENTS

Figure 4:
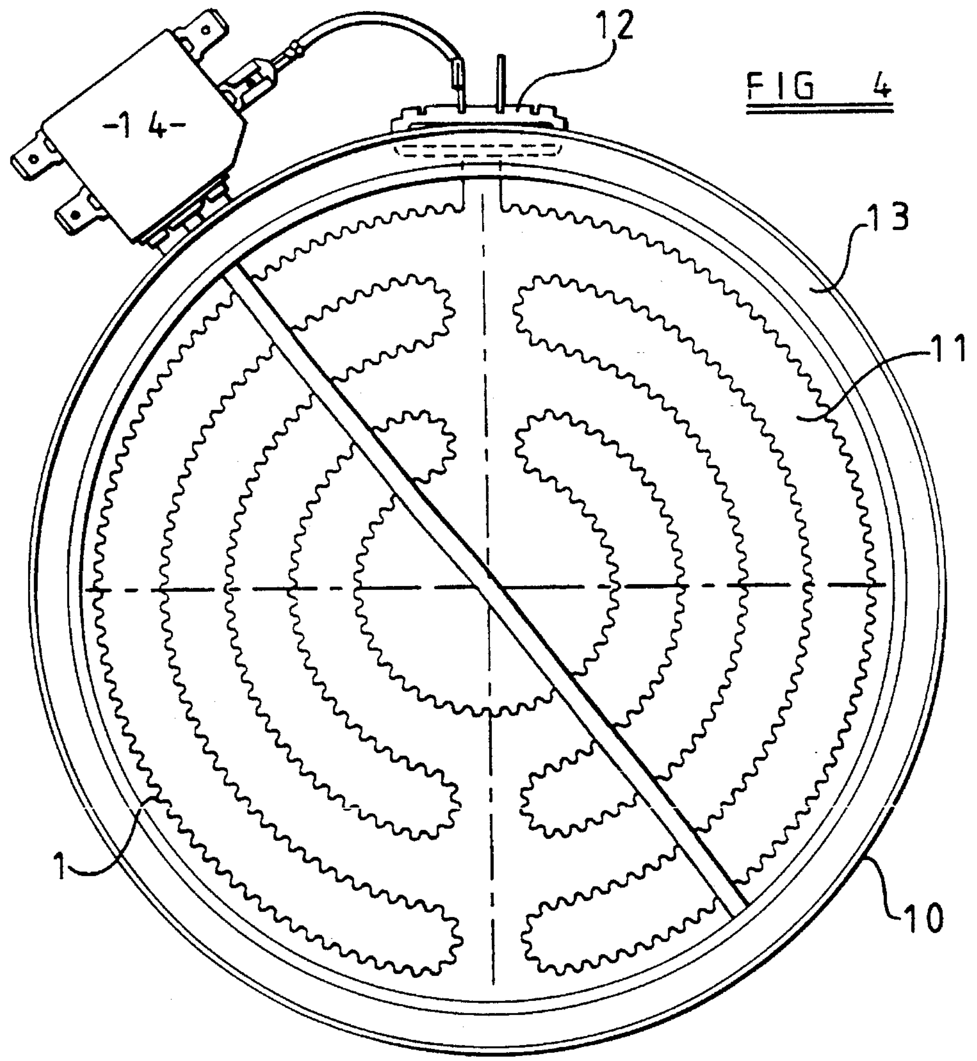
FIG. 4 is a plan view of a completed heater unit incorporating the heater of FIG. 3.

The methods to be described are intended for manufacture of a radiant electric heater having a container in the form of a metal dish with an upstanding rim and containing a layer of microporous thermal and electrical insulation material.

Such microporous thermal and electrical insulation material is well known to the skilled person and comprises one or more highly-dispersed metal oxide powders, such as silica and/or alumina, mixed with ceramic fibre reinforcement and an opacifier such as titanium dioxide. Such a material is described, for example, in GB-A-1 580 909, a typical composition being:

Pyrogenic silica 49 to 97% by weight

Ceramic fibre reinforcement 0.5 to 20% by weight

Opacifier 2 to 50% by weight (such as titanium dioxide)

Alumina 0.5 to 12% by weight

The insulating material is compacted into the dish and is required to partially embed and support a radiant electric heating element in the form of an elongate electrically conductive strip. An example of such a heating element is denoted by reference numeral 1 in FIG. 1. The elongate electrically conductive strip is provided of corrugated (also known as sinuous, serpentine or convoluted) form along its length and is shaped into the required form for the heating element, with the strip standing on edge and having a height h, such as is shown in FIG. 1. An example of a suitable material for the heating element 1 is an iron-chromium-aluminum alloy.

Referring to FIG. 2, there is shown a press 2 comprising a housing 3, a cover 4, a plunger 5 and a press tool 6. The press tool 6 may conveniently be machined from a plastics material, such as Polytetrafluoroethylene (PTFE), and has a stepped rim 7 and grooves 8 formed in its upper surface. The grooves 8 are shaped to correspond to the desired configuration of the heating element 1, such as in FIG. 1. The depth of the grooves is selected to correspond to whatever proportion of the height h of the heating element 1 is required to be exposed in the resulting heater, i.e. is required to be unembedded in the thermal insulation material. Generally, it will be desired that a major proportion of the height h of the heating element 1 will be exposed.

Provision is made for air to escape from within the press 2, for example by way of passageways 9 extending through the press tool 6 and the plunger 5. The upper end of the housing 3 is recessed to receive the rim of a metal dish 10 which will form the base of the heater.

Operation of the press 2 commences with retraction of the plunger 5 to the position shown in FIG. 2. A heating element 1, such as is shown in FIG. 1, is placed with the elongate strip thereof edgewise in the grooves 8.

A predetermined quantity of powdery microporous insulation mixture 11 (shown in dashed line), as described above, is introduced into the press 2 on top of the press tool 6 and the heating element 1. The metal dish 10 is then placed in the recess in the upper end of the housing 3 and the cover 4 is closed and secured.

The press 2 is operated, for example hydraulically, to urge the plunger 5 and the press tool 6 towards the metal dish 10, thereby compacting the insulation material 11 into the dish 10. The material 11 is compacted to a density of, typically, 300–400 kg/m$^3$, and the plunger 5 may be held in its final position for a dwell time of several seconds to several minutes as necessary.

The cover 4 is opened and the dish 10 containing the compacted insulation material 11 and the heating element 1 (shown in broken line in FIG. 2) is removed. The heating element 1 is found to be partially embedded in the insulation material 11, a major proportion of the height of the element being exposed above the surface of the insulation material 11. This proportion of the height of the element 1 which is exposed corresponds to the depth of the grooves 8 in the press tool 6. The insulation material 11 is found to have been compacted firmly around the elongate strip material of the heating element 1 thereby securing the element firmly in partial embedment in the insulation material as shown in FIG. 3.

Assembly of the complete heater, as shown in FIG. 4, may then take place as follows. Terminations are provided for the heating element 1 at a connector block 12. A ring-shaped wall 13, such as of ceramic fibre or vermiculite, is added around the inside of the rim of the dish 10, on top of the layer of insulating material 11 and protruding slightly above the edge of the rim. A well-known form of temperature-sensitive rod limiter 14 is also provided with its probe extending across the heater above the heating element 1.

Figure 5:
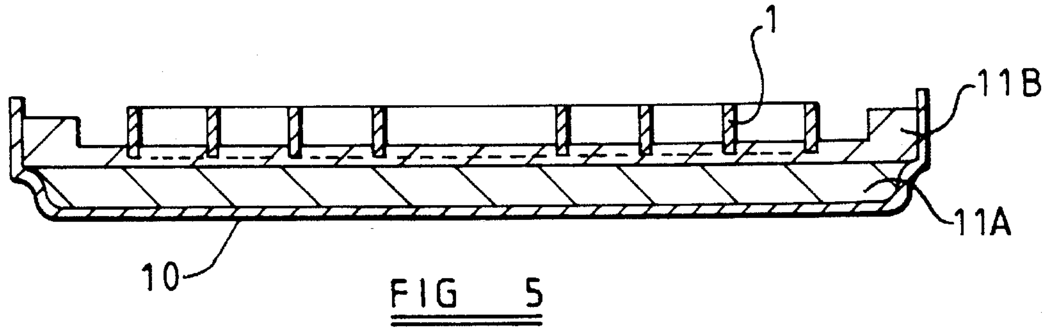
FIG. 5 is a sectional view of an alternative form of radiant heater.
Figure 6:
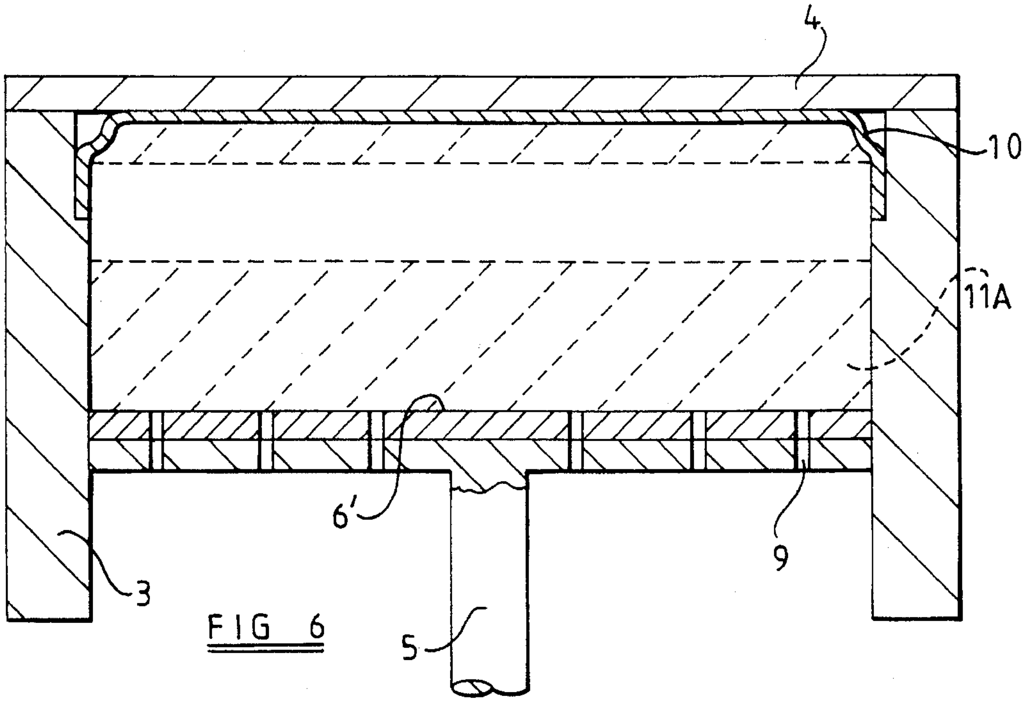
FIG. 6 is a schematic sectional view of an arrangement for use in manufacturing the radiant electric heater of FIG. 5.

In a modified version of the invention, shown in FIGS. 5 and 6, the microporous thermal insulation material comprises two layers 11A and 11B, there being a main layer 11A of silica-based material adjacent the base of the dish 10, and a surface layer 11B of alumina-based material. This surface layer 11B is preferably sufficiently thick for the embedded portion of the heating element 1 to be accommodated entirely within it.

A suitable composition for the alumina-based material comprises:

55–65 percent by weight aluminum oxide

5–15 percent by weight silica

25–35 percent by weight titanium dioxide

1–5 percent by weight ceramic fibre.

The aluminum oxide is in the form of a pyrogenic, or fume, material such as that sold under the name Aluminum Oxide C by Degussa AG.

The silica-based layer 11A is formed first in the dish 10 using, instead of the press tool 6 as illustrated in FIG. 2, a press tool 6' with no grooves 8 and without the heating element 1 being present as illustrated in FIG. 6. The material of the layer 11A is then compacted to less than its final desired density. The dish 10 containing the partially compacted insulation material 11A is then temporarily removed from the press 2 so that the grooved press tool 6, the heating element 1 and then the powdery alumina-based insulation material lib can be introduced into the press 2. The dish 10 is then replaced together with the cover 4. The alumina-based insulation material lib is then compressed onto the silica-based main layer 11A, compacting the insulation materials 11A and 11B to their final desired density and simultaneously securing the heating element 1 in place in the manner described with reference to FIG. 2.

Alternatively the two-layer arrangement shown in FIG. 5 can be manufactured in a single operation as illustrated in FIG. 2 by introducing powdery alumina-based insulation material lib into the press 2 on top of the heating element 1 and the press tool 6, then introducing the powdery silica-based insulation material 11A on top of the alumina-based material 11B, and then operating the press 2 to compact both layers of insulation material simultaneously and secure the heating element 1 in position.

The two-layer arrangement shown in FIG. 5 is advantageous in providing additional resistance to heat in the insulation material directly adjacent to the heating element 1, thereby reducing the likelihood of shrinkage which can affect silica.

Various other modifications can be made to the methods described above. Thus it is not essential for the heater to be manufactured in an inverted position. It may be manufactured by placing the powdery insulation material 11 in the dish 10, and then bringing the press tool 6, with the heating element 1 held therein, downwardly onto the insulation material 11 to compact it into the dish 10 and effect simultaneous partial embedment and securement of the heating element 1.

Figure 7:
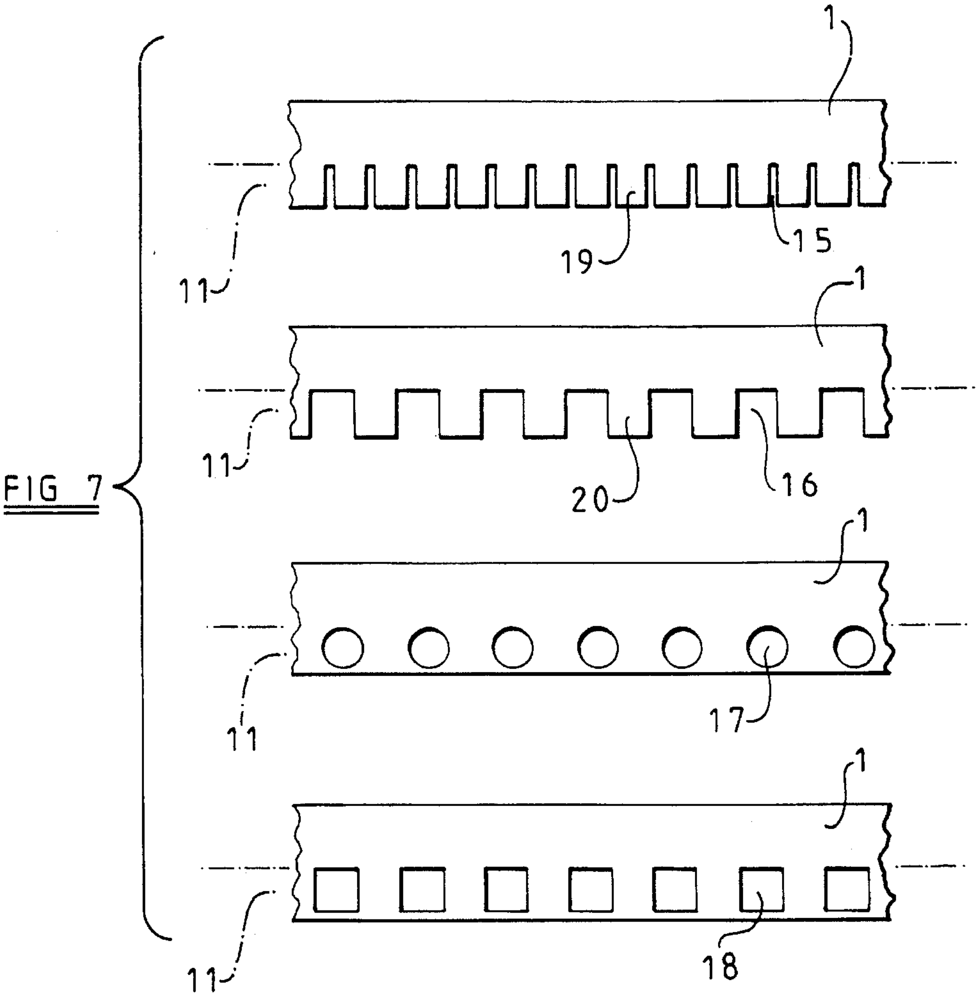

Modifications may also be advantageously effected to the profile, shape or configuration of the portion of the conductive strip heating element 1 which protrudes from the groove 8 and is embedded in the insulation material 11 during the method of the invention. Various such modifications are illustrated in FIGS. 7 and 8 and which lead to enhanced securement of the element 1 in the insulation material 11. As shown in FIG. 7, the portion of the strip heating element 1 which is embedded in the insulation material 11 may be provided with edgewise-entering slits or slots 15 or 16, or may be provided with holes 17 or 18. At least some of the strip material 19, 20 between the slits 15 or slots 16 may be twisted as illustrated in FIG. **7*a*, or bent sideways as illustrated in FIG. 7*b* prior to being embedded in the insulation material 11, to further enhance securement in the insulation material. If desired, as illustrated in FIG. 7*b*, some of the strip material between the slits or slots may be bent to one side (e.g. in a direction out of the plane of the paper in FIG. 7), while some of the strip material between others of the slits or slots may be bent to the opposite side (i.e. in a direction into the plane of the paper in FIG. 7**).

As shown in FIG. 8, the portion of the strip heating element 1 which is embedded in the insulation material 11 may include or comprise a plurality of integral tabs 21, 22, 23. Such tabs may incorporate slits 24 or slots 25 or holes 26. In the manner illustrated in FIGS. **7*a* and 7*b*, at least some of the tabs, or portions thereof may be twisted, or bent sideways, possibly some to one side (i.e. out of the plane of the paper in FIG. 8) and others to the opposite side (i.e. into the plane of the paper in FIG. 8), prior to being embedded in the insulation material 11**, to further enhance securement in the insulation material.

The arrangements shown in FIGS. 7 and 8 are further advantageous in that they also lead to enhanced performance of the resulting heater, as described in co-pending British Patent Applications, numbers 9302689.6 and 9302693.8.

We claim:

1. A method of manufacturing a radiant electric heater having an electric heating element in the form of an elongate electrically conductive strip supported on edge and partially embedded in a layer of microporous thermal and electrical insulation material in a support dish, the method comprising the steps of:

placing an elongate electrically conductive strip on edge in a groove in a press tool, such that a portion of the strip protrudes from the groove, the groove being formed of a pattern corresponding to that required for a heating element in the heater;

disposing a predetermined quantity of powdery microporous thermal and electrical insulation material between the press tool and a support dish of the heater; and compressing the insulation material into the support dish with the press tool, the material being compacted to form a layer of a desired density and simultaneously compacted against the portion of the strip protruding from the groove, to secure the strip on edge in partial embedment in the layer of the insulation material.

2. A method according to claim 1, wherein the groove in the press tool is provided of a depth corresponding to that proportion of height of the strip required to be unembedded in the layer of compacted insulation material.

3. A method according to claim 1, wherein the electrically conductive strip is of corrugated form along its length.

4. A method according to claim 1, wherein the portion of the strip protruding from the groove and which is subsequently embedded in the insulation material is configured to enhance securement of the strip in the insulation material.

5. A method according to claim 4, wherein the portion of the strip protruding from the groove is provided with a plurality of spaced-apart holes therein along the length of the strip.

6. A method according to claim 4, wherein the portion of the strip protruding from the groove incorporates a plurality of edgewise-entering slots.

7. A method according to claim 6, wherein material of the strip between at least some of the slots is twisted.

8. A method according to claim 6, wherein material of the strip between at least some of the slots is bent sideways.

9. A method according to claim 8, wherein the strip material between some of the slots is bent sideways to one side, while the strip material between others of the slots is bent sideways to the opposite side.

10. A method according to claim 4, wherein the portion of the strip protruding from the groove incorporates a plurality of edgewise-entering slits.

11. A method according to claim 10, wherein material of the strip between at least some of the slits is twisted.

12. A method according to claim 10, wherein material of the strip between at least some of the slits is bent sideways.

13. A method according to claim 12, wherein the strip material between some of the slits is bent sideways to one side, while the strip material between others of the slits is bent sideways to the opposite side.

14. A method according to claim 4, wherein the portion of the strip protruding from the groove incorporates spaced-apart tabs integral with the strip.

15. A method according to claim 14, wherein at least some of the tabs incorporate holes.

16. A method according to claim 14, wherein at least some of the tabs incorporate edgewise-entering slits.

17. A method according to claim 14, wherein at least some of the tabs incorporate edgewise-entering slots.

18. A method according to claim 14, wherein at least a part of at least some of the tabs are twisted.

19. A method according to claim 14, wherein at least a part of at least some of the tabs are bent sideways.

20. A method according to claim 19, wherein the at least a part of one or more of the tabs are bent to one side and one or more others are bent to the opposite side.

21. A method according to claim 1, wherein the electrically conductive strip is selected from the group consisting of a metal and a metal alloy.

22. A method according to claim 21, wherein the metal alloy comprises an iron-chromium-aluminum alloy.

23. A method according to claim 1 and including the step of disposing a predetermined quantity of an additional microporous insulation material between the said powdery microporous insulation material and the support dish.

24. A method according to claim 23, wherein the additional insulation material is based on silica and the insulation material adjacent the heating element is based on alumina.

25. A method according to claim 1 and including a preliminary step of disposing a predetermined quantity of an additional microporous insulation material between an additional press tool and the support dish, the additional insulation material being compressed into the support dish by means of the additional press tool.

26. A method according to claim 25, wherein the additional insulation material is compressed, in the preliminary step, to a density below its desired final density, the final density being attained during the subsequent compression step involving the electrically conductive strip with its associated insulation material.

27. A method according to claim 25, wherein the additional insulation material is based on silica and the insulation material adjacent the heating element is based on alumina.

28. A method according to claim 1, wherein the insulation material adjacent the heating element is based on alumina.

29. A method according to claim 1, wherein the insulation material is based on silica.

* * * * *